US009099366B2

(12) United States Patent
Roy et al.

(10) Patent No.: US 9,099,366 B2
(45) Date of Patent: Aug. 4, 2015

(54) PHOTOSITE WITH PINNED PHOTODIODE

(75) Inventors: Francois Roy, Seyssins (FR); Julien Michelot, Grenoble (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 456 days.

(21) Appl. No.: 13/529,045

(22) Filed: Jun. 21, 2012

(65) Prior Publication Data

US 2013/0049155 A1    Feb. 28, 2013

(30) Foreign Application Priority Data

Aug. 22, 2011  (FR) ...................................... 11 57433

(51) Int. Cl.
*H01L 27/146* (2006.01)
*H01L 31/0352* (2006.01)

(52) U.S. Cl.
CPC ...... *H01L 27/14603* (2013.01); *H01L 27/1461* (2013.01); *H01L 27/1464* (2013.01); *H01L 27/14638* (2013.01); *H01L 27/1463* (2013.01); *H01L 27/14607* (2013.01); *H01L 31/0352* (2013.01)

(58) Field of Classification Search
CPC ..................... H01L 27/14607; H01L 31/0352; H01L 27/1464; H01L 27/1463
See application file for complete search history.

(56) References Cited

U.S. PATENT DOCUMENTS

| 2004/0094783 A1 | 5/2004 | Hong |
| 2008/0283726 A1 | 11/2008 | Uya et al. |
| 2009/0072337 A1* | 3/2009 | Lee .............................. 257/440 |
| 2010/0207231 A1* | 8/2010 | Iwamoto et al. .............. 257/461 |

FOREIGN PATENT DOCUMENTS

| EP | 2355156 A1 | 8/2011 |
| WO | WO-2009123244 A1 | 10/2009 |

OTHER PUBLICATIONS

INPI Search Report and Written Opinion for FR1157433 mailed Jan. 31, 2012 (8 pages).

* cited by examiner

*Primary Examiner* — Kimberly Rizkallah
*Assistant Examiner* — Alexander Belousov
(74) *Attorney, Agent, or Firm* — Gardere Wynne Sewell LLP

(57) ABSTRACT

A photosite is formed in a semiconductor substrate and includes a photodiode confined in a direction orthogonal to the surface of the substrate. The photodiode includes a semiconductor zone for storing charge that is formed in an upper semiconductor region having a first conductivity type and includes a main well of a second conductivity type opposite the first conductivity type and laterally pinned in a first direction parallel to the surface of the substrate. The photodiode further includes an additional semiconductor zone including an additional well having the second conductivity type that is buried under and makes contact with the main well.

22 Claims, 7 Drawing Sheets

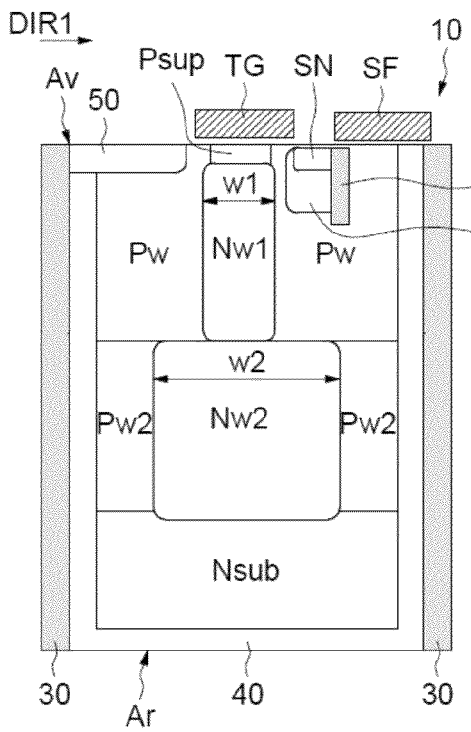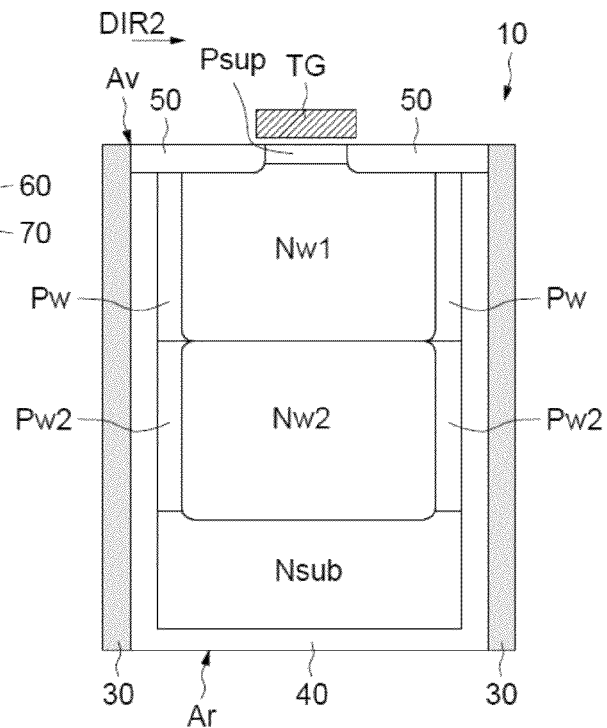
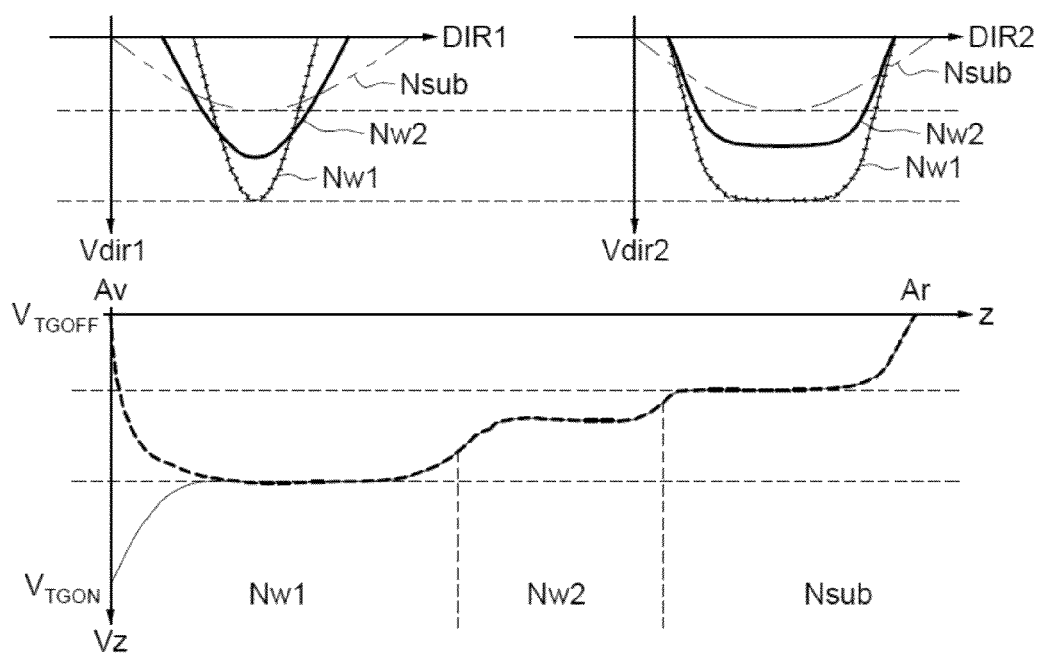

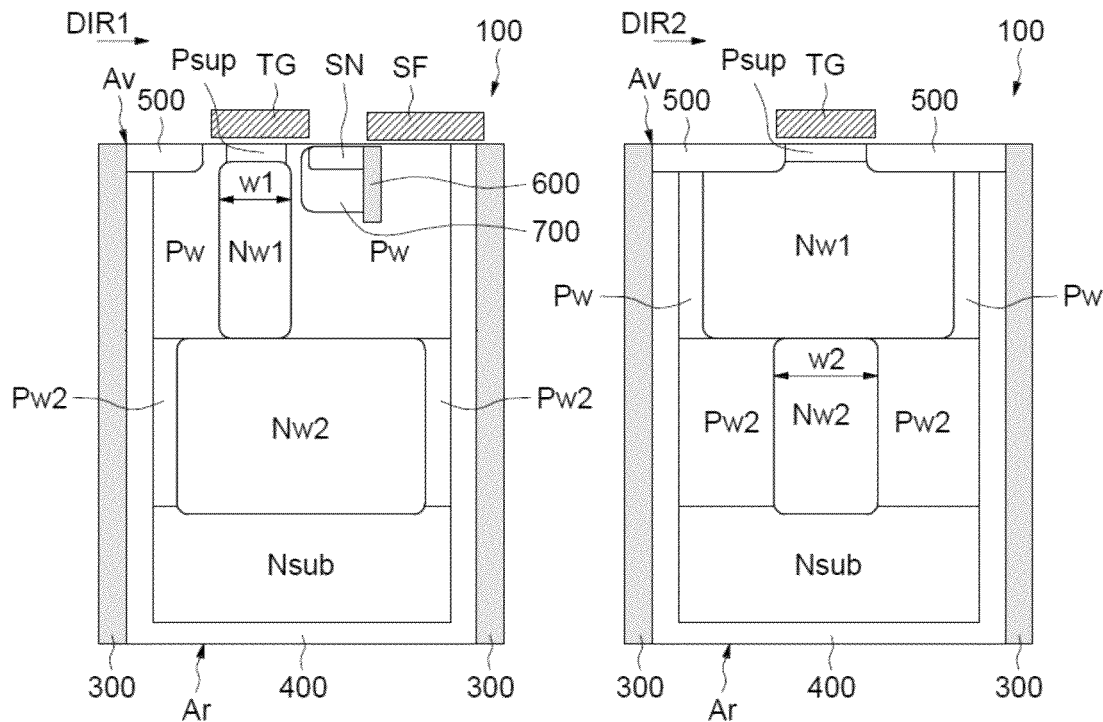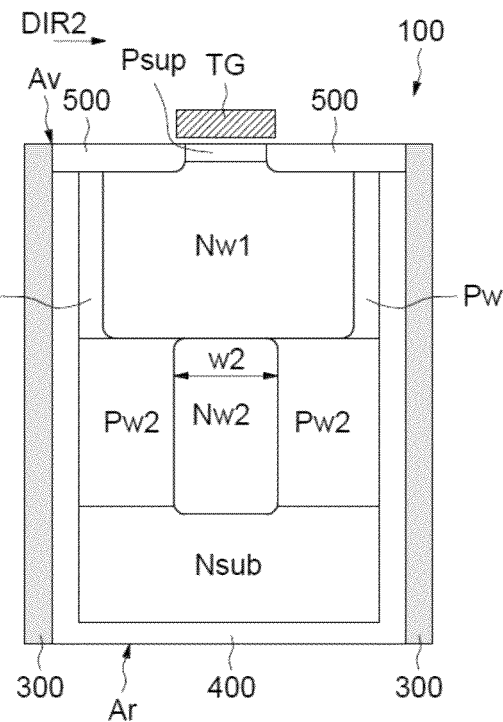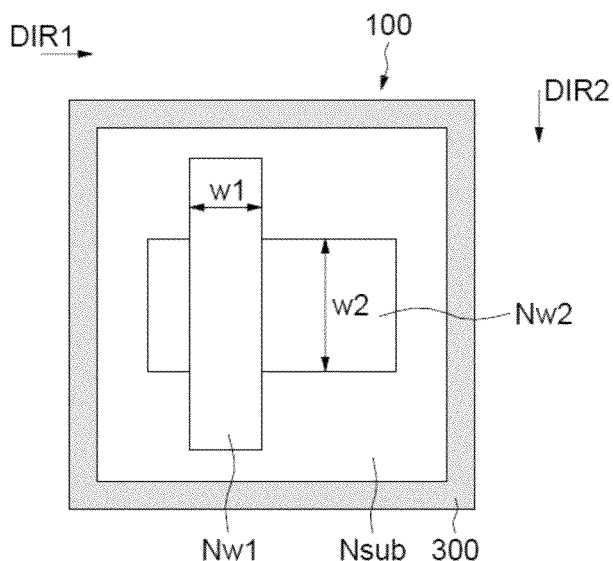

US 9,099,366 B2

PHOTOSITE WITH PINNED PHOTODIODE

PRIORITY CLAIM

This application claims priority from French Application for Patent No. 1157433 filed Aug. 22, 2011, the disclosure of which is hereby incorporated by reference.

TECHNICAL FIELD

The invention relates to imaging devices comprising matrix arrays of photosites, the photosites more particularly comprising vertically confined photodiodes with laterally pinned charge storage zones.

BACKGROUND

An imaging device, or sensor, is a photosensitive electronic component used to convert electromagnetic radiation into an analog electrical signal. This signal is then amplified and digitized by an analog-to-digital converter and finally processed in order to obtain a digital image.

The imaging device employs the photoelectric effect. An imaging device generally comprises photosites arranged in a matrix, each photosite corresponding to a pixel of an image.

A photosite comprises at least one photosensitive zone, especially a photodiode, and a zone where charge accumulated in the photodiode is read. Photons captured by a photodiode of a photosite are converted into electron/hole pairs. Charge of a first type, for example holes, created in the photosensitive zones is drained depthwise towards the substrate (p+) and charge of a second type, for example electrons, is stored in the photosite before being read by virtue of an electronic system.

Generally, this electronic system, which controls the photodiode, comprises, especially when the photodiode is a fully depleted photodiode, a transfer transistor that controls the transfer of charge stored in the photodiode to a zone where the charge is read. This charge read zone forms a sensing node to which conventional read electronics are connected, especially comprising a read transistor.

A photodiode functions in a cycle comprising at least one integration step, one measurement step, and one reset step. The integration step corresponds to the photogeneration of charge and its accumulation during exposure of the photodiode to light. The measurement step corresponds to the generation of a signal depending on the amount of photogenerated charge accumulated in the photodiode. The reset step corresponds to the removal of the photogenerated charge.

In FIGS. 1a to 1c, a photosite 1 according to the prior art is schematically represented. FIG. 1a schematically illustrates a top view of the photosite 1, FIG. 1b shows a cross-sectional view through the photosite 1 in FIG. 1a in the plane B-B', and FIG. 1c shows a cross-sectional view through the photosite 1 in FIG. 1a in the plane C-C'.

The photosite 1 comprises, in a semiconductor substrate, a vertically confined photodiode 2. The photosite 1 is bounded, in the substrate, by trench isolation 3.

The photodiode 2 comprises a charge storage zone defined by an n-type semiconductor well Nw produced in an intermediate p-type semiconductor region Pw lying vertically between a lower p-type semiconductor zone Pinf and an upper p-type semiconductor zone Psup. The photosite 1 comprises a charge read zone SN placed opposite the charge storage zone of the photodiode 2 on the surface of the substrate. The photodiode 2 is a pinned photodiode in that it comprises an n-type charge storage zone Nw lying between two p-type zones, in this case the intermediate semiconductor zones Pw, the upper semiconductor zone Psup and the lower semiconductor zone Pinf. The pinning of the photodiode 2 allows a vertical potential well to be created in the charge storage zone Nw, which well is completely depleted of free carriers, allowing photogenerated charge to be accumulated in the charge storage zone Nw before said charge is transferred to the charge read zone SN of the photosite 1.

The photodiode 2 comprises a zone for collecting charge, which zone is separated from trench isolation 3 by a p-type passivation zone 4, the dopant concentration of which is much higher than the dopant concentration in the p-type zones of the collection zone. The passivation zone 4 also separates the lower semiconductor zone Pinf from the lower surface, or back side Ar, of the photosite 1.

Passivation of the upper surface, or front side Av, of the photodiode 2, is achieved by a surface passivation 5 that also possesses a much higher dopant concentration than the dopant concentration in the p-type zones of the collection zone.

The photosite 1 also comprises a charge transfer transistor TG overhanging the well Nw, enabling the transfer of charge to the read zone SN, and a follower transistor SF, allowing the signal measured by the read zone SN to be amplified. The photosite 1 also comprises means 6 for isolating the read node SN, which is placed between the well Nw and the isolating means 6, a passivation well 7 placed under the read node SN, and two isolating zones 8 lying between the isolating means 6 and the trench isolation 3 so as to isolate the follower transistor SF from the charge transfer transistor TG.

The semiconductor well Nw forming the charge storage zone is laterally pinned in a direction parallel to the surface of the semiconductor substrate. This is done in order to increase the amount of charge that the photodiode 2 can store, by increasing the dopant concentration. Lateral pinning of the charge storage zone Nw reduces the width of the well to be implanted. However, the smaller the width of the well Nw, the harder it becomes to produce a charge storage zone Nw right through the entire depth of the substrate.

Consequently, part of the charge collection zone does not contain a potential well allowing photogenerated charge to be stored. The charge created in the parts with no potential well is very unlikely to recombine in the charge collection zone. This charge may then drift until it passes into a passivation zone 4 or 5 in which the recombination probability is higher. The loss of charge due to recombination degrades the performance of the photodiode 2.

In particular, in the case where the photosite is back-lit, via the back side Ar, photons, especially short-wavelength photons such as blue photons, create charge at small depths in the substrate, i.e. just below the surface of the back side Ar. This charge is therefore created at a greater distance from the charge storage zone than the charge created by photons of longer wavelength, such as red photons, which generate charge deeper in the substrate. The charge created by blue photons is more likely to be lost to electronic recombination in a passivation zone than the charge created by red photons.

SUMMARY

According to one embodiment, a photosite is provided comprising buried means that reduce charge loss due to electronic recombination in the passivation zones surrounding the charge collection zone of the photodiode of the photosite.

According to one aspect, a photosite is provided comprising, in a semiconductor substrate, a photodiode confined in a direction orthogonal to the surface of the substrate comprising a semiconductor zone for storing charge comprising, in an upper semiconductor region having a first conductivity type, a main well of a second conductivity type opposed to the first and pinned in a first direction parallel to the surface of the substrate.

The photodiode is vertically confined, i.e. in a direction orthogonal to the surface of the substrate, in that it comprises a semiconductor zone of one conductivity type lying between two semiconductor zones of an opposite conductivity type.

According to one general feature, the charge storage zone furthermore comprises semiconductor means buried under and making contact with the main well having the second conductivity type.

The depth of the laterally pinned main well is limited by production techniques. By burying the semiconductor means having the same conductivity type, in this case the second conductivity type, as the main well immediately under and in contact with the main well, a potential well is generated in the charge collection zone under the main well, thus extending the charge storage zone in the depth direction of the photodiode. The additional potential well thus created reduces the loss of charge photogenerated in the charge collection zone, said loss being caused by migration of charge out of said charge collection zone.

Preferably, the buried means have a lower dopant concentration than the dopant concentration in the main well.

In this way, the potential well of the buried means is less deep than the potential well of the main well, thereby allowing, during the transfer of charge from the charge storage zone to the charge read zone, all the charge accumulated in the potential well of the buried means to be transferred to the read zone via the potential well of the main well. Such a configuration thus prevents residual charge left behind after a charge transfer step from degrading the performance of the photodiode.

The photosite preferably comprises a semiconductor layer having the first conductivity type placed between the upper semiconductor region and a lower part of the substrate, the buried semiconductor means comprising, in said semiconductor layer, a vertical sequence of at least one additional semiconductor well having the second conductivity type, each additional well of the vertical sequence, lying between the first additional well and the last additional well of the vertical sequence, only making contact with a preceding additional well and a following additional well.

The buried means may thus comprise an additional well or a succession of additional wells of the same conductivity type as the main well, each well being buried under and making contact with an immediately preceding well. Each additional well thus extends the charge storage zone depthwise in the substrate and reduces the amount of charge lost.

Advantageously, the additional well buried immediately under and in contact with the main well may have a lower dopant concentration than the dopant concentration in the main well, and each other additional well may have a lower dopant concentration than the dopant concentration in the additional well under which it is buried.

In this way, the succession of semiconductor wells formed by the main well and the additional wells forms a succession of potential wells of decreasing minimum value, thus ensuring all the charge accumulated in the charge storage zone is transferred during transfer from the charge storage zone to the read zone. This prevents residual charge from being left behind after a charge transfer signalled by the charge transfer transistor.

Advantageously, at least one additional well of the vertical sequence may be pinned in a pinning direction corresponding to the first direction so as to increase the dopant concentration in the well and therefore the charge storage capacity of said additional well.

Preferably, each additional well pinned in the first direction is centered, in the first direction, with the well under which it is buried.

Centering, in the first direction, an additional well pinned in the first direction with the additional or main semiconductor well under which it is buried, and with which it makes contact, reduces the risk of leaving residual charge behind after a charge transfer step. This is because centering an additional well pinned in the first direction relative to the preceding well aligns the maxima of the potential wells so as to obtain a potential profile with no potential barriers between two successive semiconductor wells. A potential well maximum corresponds to the bottom of the potential well.

Advantageously, at least one additional well of the vertical sequence is pinned in a pinning direction corresponding to a second direction parallel to the surface of the substrate and orthogonal to the first direction.

In the case of small pixels, the transfer transistor is not in the center of the photosite. Therefore, the main well under the charge transfer transistor is also off-center relative to the central axis of the photosite, so as to be placed under the charge transfer transistor.

Pinning an additional semiconductor well in a direction orthogonal to the first direction and parallel to the surface of the substrate makes it possible to obtain an additional semiconductor well that has a width in the first direction that occupies almost the entire available width of the substrate and that is laterally pinned in the second direction.

Preferably, each additional well pinned in the second direction is centered, in the second direction, with the well under which it is buried.

Centering, in the second direction, an additional well pinned in the second direction with the semiconductor well under which it is buried and with which it is in contact allows the maxima of two successive potential wells pinned in the same direction to be aligned, or it allows the maxima of two successive potential wells pinned in two orthogonal directions to be superposed, so as to prevent potential barriers from forming between two successive semiconductor wells.

Preferably, the main well possesses a pinned width in the pinning direction of the main well, each additional pinned well possessing a corresponding pinned width in the pinning direction of said additional well, the additional well buried immediately under and making contact with the main well having a pinned width that is larger than the pinned width of the main well, and each other additional well having a pinned width that is larger than the pinned width of the additional well immediately under which it is buried.

Increasing the pinned width of the additional semiconductor wells as they are buried progressively deeper in the substrate ensures, in combination with the progressive reduction in the dopant concentration as the additional semiconductor wells are buried depthwise, that the potential well formed by an additional well is less deep than the potential well formed by the additional well lying immediately above.

Advantageously, the substrate may be a semiconductor substrate of the second conductivity type and the buried means may then comprise the lower part of the semiconductor substrate.

By using a substrate of the second conductivity type, the potential well created in the lower part of the substrate makes it easier to retain charge in the photodiode and thus allows the level of charge loss to be reduced. Since the photosite comprises a passivation zone of the first conductivity type on the surfaces of the substrate, the photodiode is also a vertically confined photodiode.

In another embodiment, the substrate may be a semiconductor substrate of a first conductivity type.

According to another aspect, an imaging device is provided formed in a semiconductor substrate comprising a matrix array of photosites as described above.

BRIEF DESCRIPTION OF THE DRAWINGS

Other advantages and features of the invention will become clear on examining the detailed description of non-limiting implementations and embodiments, and the appended drawings in which:

FIGS. 5a and 5b show two cross-sectional views of a second exemplary photosite according to the first embodiment;

FIG. 6 schematically illustrates the potential wells generated in the semiconductor wells and lower part of the substrate of the photosite in FIGS. 5a and 5b;

FIGS. 9a and 9b show two cross-sectional views of a second exemplary photosite according to the second embodiment;

FIG. 10 shows a schematic representation of the layout of the main well and the additional well in the substrate of the photosite in FIGS. 9a and 9b;

DETAILED DESCRIPTION OF THE DRAWINGS

Figure 1A:
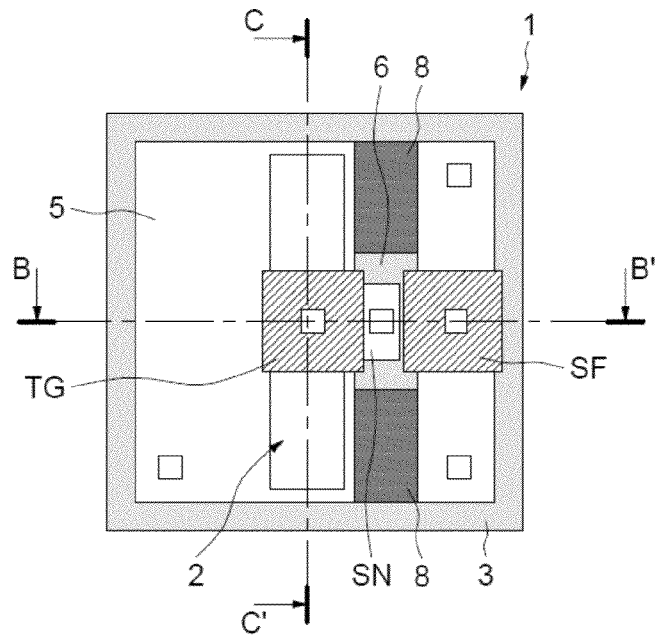
FIGS. 1a to 1c, described above, show schematically a photosite according to the prior art.
Figure 1B:
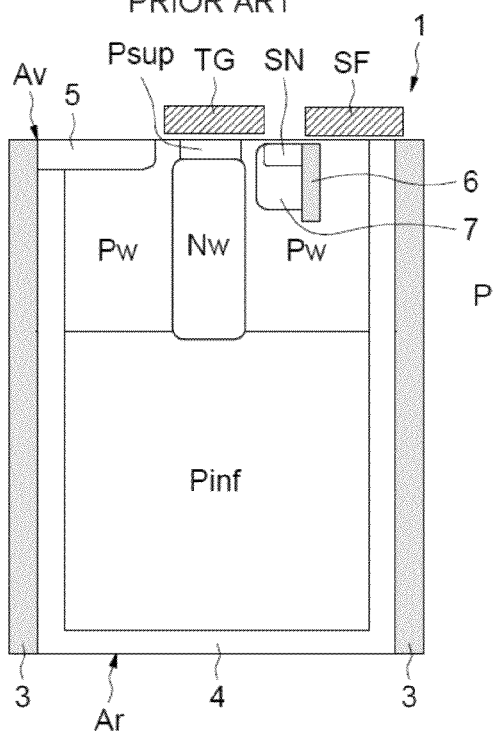
Figure 1C:
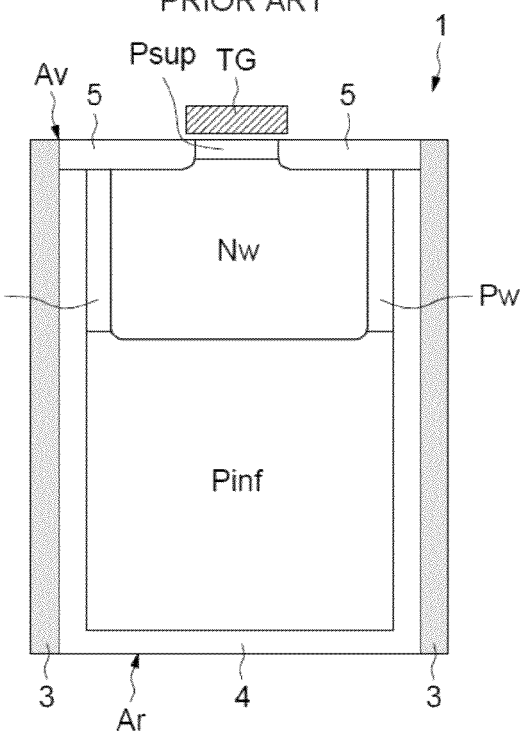
Figure 2:
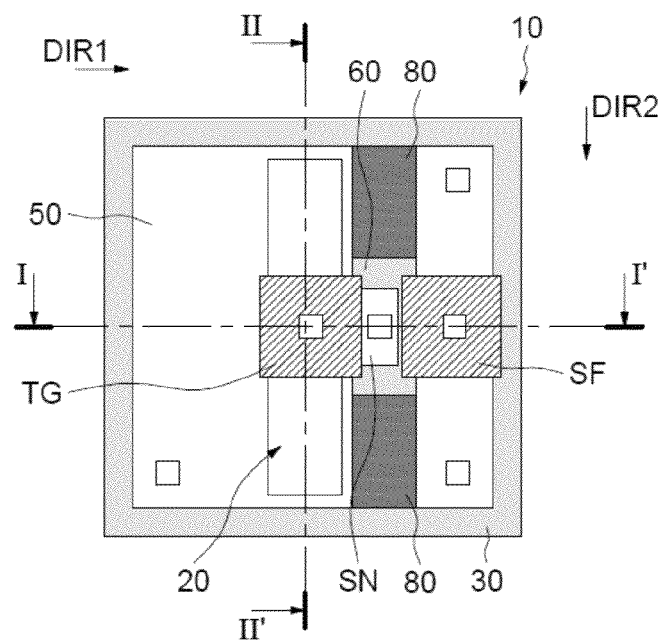
FIG. 2 shows a top view of a photosite according to a first embodiment.

FIG. 2 shows a top view of a photosite according to a first embodiment. In this first embodiment, the photosite 10 comprises a photodiode 20 produced in a semiconductor substrate. The photosite 10 is bounded on its external perimeter by trench isolation 30. The photosite 10 also comprises a charge transfer transistor TG for transferring charge accumulated in the photodiode 20 to a read zone SN placed in the substrate between the photodiode 20 and means 60 for isolating the charge read zone SN. The photosite 10 also comprises a follower transistor SF for amplifying the signal measured by the read node.

In this first embodiment, the photosite 10 is sufficiently large for the charge transfer transistor TG to be located in the center of the area of the photosite 10. Since the photodiode 20 is located in the substrate of the photosite, directly under the charge transfer transistor TG, the photodiode 20 is centered on the front side Av of the photosite 10.

The front side Av of the photosite 10 corresponds to the side illustrated in FIG. 2, i.e. the side on which the charge transfer transistor TG and the follower transistor SF are placed. The photosite 10 also comprises a back side Ar opposite the front side Av.

In the first embodiment of the photosite 10, illustrated in FIG. 2, several configurations are possible depthwise in the substrate.

Figure 3A:
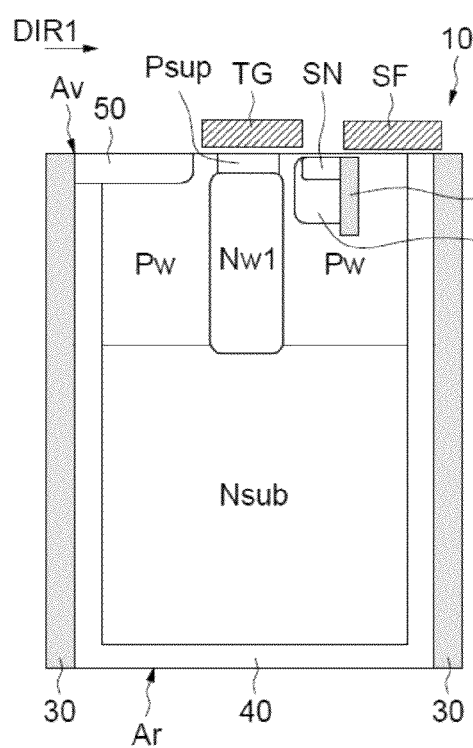
FIGS. 3a and 3b show two cross-sectional views of a first exemplary photosite according to the first embodiment.
Figure 3B:
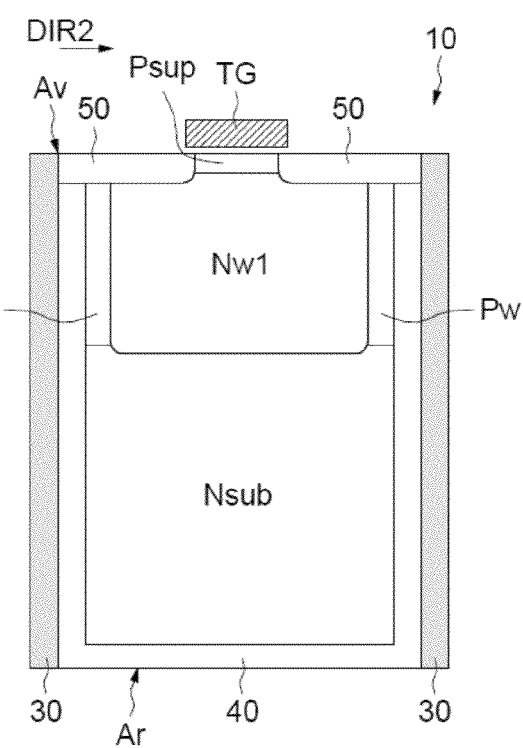

FIGS. 3a and 3b illustrate a cross-sectional view in the plane I-I' and a cross-sectional view in the plane II-II' of a first exemplary depthwise configuration of the photosite 10 according to the first embodiment illustrated in FIG. 2.

The photodiode 20 of the photosite 10 comprises a main n-type semiconductor well Nw1 pinned in a first direction DIR1 parallel to the front side Av so as to increase its charge storage capacity. The main well is produced in an intermediate p-type semiconductor region Pw.

The photosite 10 is produced in an n-type substrate Nsub doped with a lower dopant concentration than the dopant concentration of the main well Nw1. The main well Nw lies vertically between a lower part of the substrate Nsub and an upper p-type semiconductor zone Psup.

The substrate Nsub and the intermediate region Pw are separated from the trench isolation 30 by a p-type passivation zone 40 doped with a higher dopant concentration than the intermediate region Pw and the upper zone Psup. The passivation zone 40 is produced so as to also cover the surface of the back side Ar. The photosite 10 also comprises p-type means 50 for passivating the front side Av, the means being doped with a dopant concentration similar to that of the passivation zone 40.

A passivation well 70 is placed under and in contact with the read zone SN, and isolating means 60 are placed in contact with the read zone SN between the read zone SN and a trench isolation 30. The passivation well 70 and the isolating means 60 allow the read zone SN to be isolated from the rest of the photodiode, except the main well Nw1. Thus, only charge in the main well Nw1 can be transferred to the read zone SN.

The photodiode 20 also comprises two isolating zones 80 lying between the isolating means 60 and the trench isolation 30 so as to isolate the follower transistor SF from the charge transfer transistor TG.

The photodiode 20 comprises a charge collection zone comprising the upper zone Psup, the intermediate region Pw, the main well Nw1 and the semiconductor substrate Nsub.

In this first exemplary configuration of a photosite 10 according to the first embodiment, the photodiode 20 comprises a charge storage zone comprising the main well Nw1 and the lower part of the substrate Nsub, i.e. the substrate part Nsub under and making contact with the main well Nw1. Since the substrate Nsub is doped n-type, it creates a potential well relative to the passivation zone 40, said potential well making it possible for the collected charge to be retained, thus reducing the rate of charge loss.

The photodiode 20 is a vertically confined photodiode in that it comprises an n-type semiconductor zone, the main well and the lower part of the substrate Nsub, lying between two p-type semiconductor zones, the part of the passivation zone 40 covering the back side Ar and the passivation means 50 associated with the upper zone Psup covering the front side Av.

Figure 4:
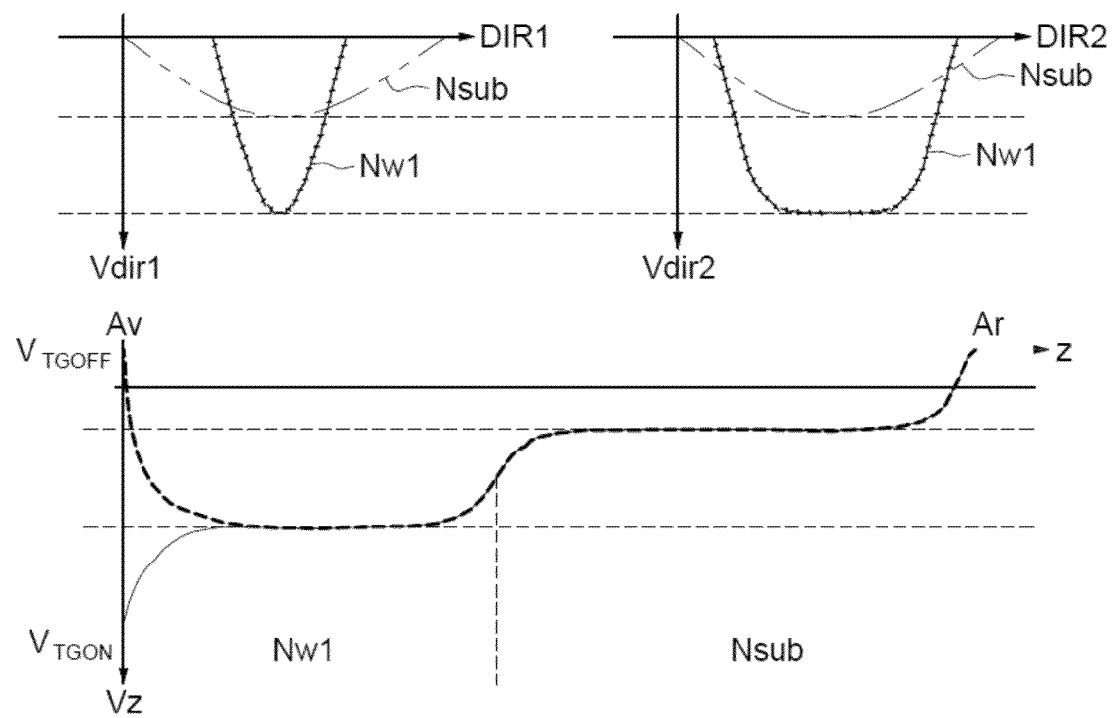
FIG. 4 schematically illustrates the potential wells generated in the main well and lower part of the substrate of the photosite in FIGS. 3a and 3b.

FIG. 4 shows potential profiles in the first direction DIR1 parallel to the surface of the substrate, in the second direction DIR2 parallel to the surface of the substrate, and in the depth direction z through the substrate.

In the graphs showing the potential profiles in the first direction DIR1 and in the second direction DIR2, the axis-dashed line represents the potential well generated by the lower part of the substrate Nsub, whereas the crossed line represents the potential well generated by the main well Nw1. It will be noted that the first embodiment in which the main well is centered allows the maximum of the potential well of the main well Nw1 to be centered with the maximum of the potential well of the lower part of the substrate Nsub in the first direction DIR1 and in the second direction DIR2.

The third graph shows the variation of the potential in the depth direction through the substrate between the front side Av and the back side Ar. It may be seen that the potential well of the main well Nw1 is deeper than the potential well of the lower part of the substrate Nsub. This allows, during charge transfer from the charge storage zone to the charge read zone SN, i.e. when a potential $V_{TGON}$ is applied to the gate of the charge transfer transistor instead of a potential $V_{TGOFF}$, all the charge to be transferred, with no residual charge being left behind after the charge transfer. The dashed line in the graph represents the potential profile when the charge transfer transistor TG is turned off with a potential $V_{TGOFF}$, i.e. when the photodiode 20 is accumulating charge, and the continuous line represents the potential profile when the charge transfer transistor TG is turned on, by applying a potential $V_{TGON}$ to the gate of the charge transfer transistor TG.

FIGS. 5a and 5b respectively illustrate a cross-sectional view in the plane I-I' and a cross-sectional view in the plane II-II' of a second exemplary depthwise configuration of the photosite 10 of the first embodiment illustrated in FIG. 2.

Elements with the same references in FIGS. 2, 3a, 3b, 5a and 5b are identical.

In this second exemplary configuration, an additional semiconductor well Nw2 has been added between the main well Nw1 and the lower part of the substrate Nsub. To do this, the lower part of the substrate Nsub has been thinned in the depth direction z. The additional well Nw2 is produced in an additional p-type semiconductor region Pw2, the dopant concentration of which is lower than that of the passivation zone 40.

In order to increase the storage capacity of the charge storage zone, now consisting of the main well Nw1, the additional well Nw2 and the lower part of the substrate Nsub, the additional well Nw2 is pinned in the first direction DIR1, i.e. it is pinned in the same direction as the main well Nw1. The lateral pinning of the additional well Nw2 in the first direction DIR1 allows the dopant concentration to be increased relative to a configuration where the additional well Nw2 is not laterally pinned, which would be a configuration equivalent to the first exemplary configuration illustrated in FIGS. 3a and 3b. The increase in the dopant concentration allows the charge storage capacity of the additional well Nw2 to be increased.

The additional well is pinned laterally in the first direction DIR1 with a smaller pinned width W2 than the pinned width W1 of the main well Nw1. In addition, the dopant concentration of the additional well Nw2 is lower than the dopant concentration of the main well Nw1. These two characteristics ensure that the potential well of the additional well Nw2 is less deep than the potential well of the main well Nw1.

In addition, the additional well Nw2 is centered in the first direction with the main well Nw1, so as to ensure that all the charge accumulated in the potential well of the additional well Nw2 is transferred to the main well Nw1. Specifically, centering the additional well Nw2 with the main well Nw1 prevents a possible potential barrier from forming, which would lead to residual charge being left behind after a charge transfer step.

Since the main well is centered relative to the photosite 10 in this first embodiment, the lower part of the substrate is centered with the main well Nw1 and the additional well Nw2.

This configuration therefore allows the storage capacity of the charge storage zone to be increased relative to the simpler configuration of the first example, illustrated in FIGS. 3a and 3b, while avoiding residual charge.

FIG. 6 shows potential profiles in the first direction DIR1 parallel to the surface of the substrate, in the second direction DIR2 parallel to the surface of the substrate, and in the depth direction z through the substrate.

In the graphs showing the potential profiles in the first direction DIR1 and in the second direction DIR2, the axis-dashed line represents the potential well generated by the lower part of the substrate Nsub, the continuous line represents the potential well generated by the additional well Nw2, and the crossed line represents the potential well generated by the main well Nw1. It will be noted that in this second exemplary configuration of the first embodiment, the maximum of the potential well of the main well Nw1 is centered with the maximum of the potential well of the additional well Nw2 and the maximum of the well of the lower part of the substrate Nsub in the first direction DIR1 and in the second direction DIR2.

In the third graph, the variation of the potential in the depth direction z through the substrate, between the front side Av and the back side Ar, has been shown. It may be seen that the potential well of the main well Nw1 is deeper than the potential well of the additional well Nw2, which is deeper than the potential well of the lower part of the substrate Nsub. This makes it possible, when charge is transferred from the charge storage zone to the charge read zone SN, for all the charge to be transferred, and for no residual charge to be left behind after the charge transfer step.

In a variant of the second example of the first embodiment, it is possible to produce the photosite in a p-type semiconductor substrate. In this case, the charge storage capacity is reduced and the rate of charge loss is increased, relative to the second exemplary configuration of the first embodiment, because the charge storage zone is smaller in the depth direction.

Figure 7:
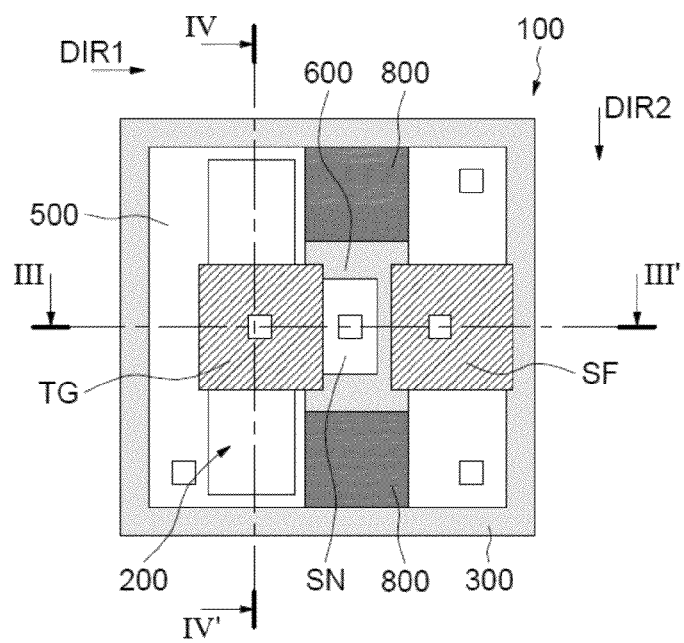
FIG. 7 shows a top view of a photosite according to a second embodiment.

FIG. 7 shows a top view, i.e. of the front side Ar, of a photosite 100 according to a second embodiment comprising a photodiode 200 produced in a semiconductor substrate. The photosite 100 is bounded on the external perimeter by a trench isolation 300 and also comprises a transfer transistor TG able to transfer charge accumulated in the photodiode 200 to a read zone SN placed between the photodiode 200 and means 600 for isolating the charge read zone SN and a follower transistor SF able to amplify the signal measured by the read node SN.

In this second embodiment, the photosite 100 has smaller dimensions than the photosite 100 of the first embodiment, not allowing the transfer transistor TG to be centered above the front side Av of the photosite 100, therefore preventing the photodiode 200 from being centered with the substrate and, more particularly, preventing the main well Nw1 contained in the photodiode 200 from being centered with the lower part of the substrate Nsub. As a result, residual charge is left behind after a charge transfer step.

Figure 8:
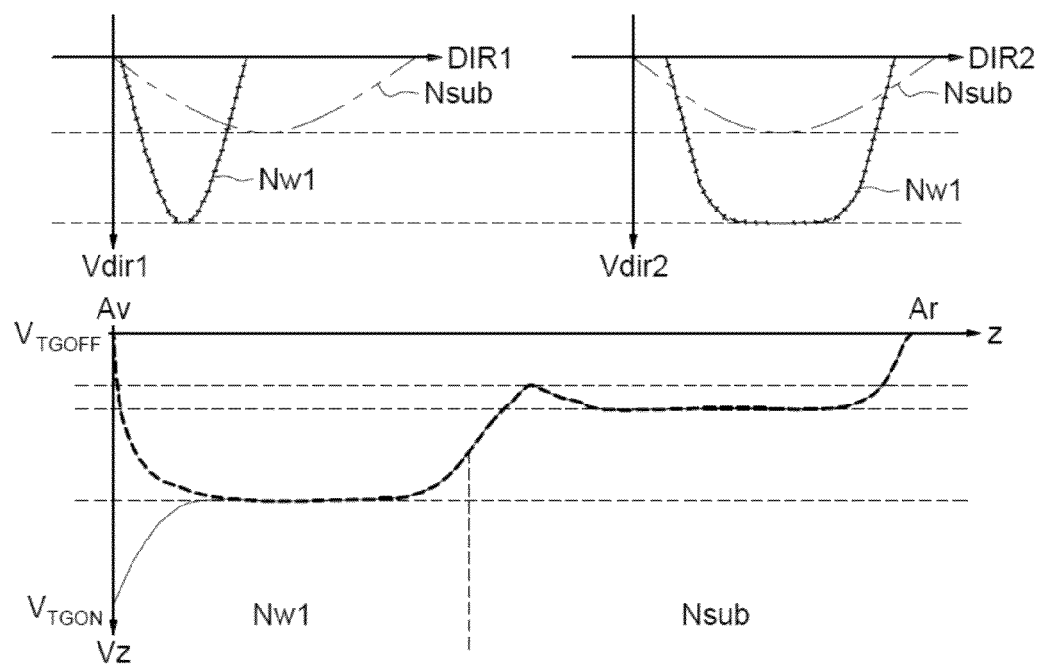
FIG. 8 schematically illustrates the potential wells generated in the main well and lower part of the substrate of the photosite in FIG. 7.

FIG. 8 shows potential profiles in the first direction DIR1 parallel to the surface of the substrate, in the second direction DIR2 parallel to the surface of the substrate, and in the depth direction z through the substrate.

In the graphs showing the potential profiles in the first direction DIR1 and in the second direction DIR2, the axis-dashed line represents the potential well generated by the lower part of the substrate Nsub, and the crossed line represents the potential well generated by the main well Nw1. It will be noted that the second embodiment, in which the main well is not centered, does not allow the maximum of the potential well of the main well Nw1 to be centered with the maximum of the potential well of the lower part of the substrate Nsub in the first direction DIR1 and in the second direction DIR2.

As a result, a potential barrier is created in the depth directions, preventing all the charge from being transferred from one well to another, causing residual charge to be left behind after a charge transfer step.

The third graph shows the variation of the potential in a depthwise-related direction through the substrate between the front side Av and the back side Ar. In order to make the physics easier to understand, the z direction is not exactly perpendicular to the surface of the substrate, but passes through the maxima of the two potential wells.

A potential barrier can clearly be seen between the potential well of the main well Nw1 and the potential well of the lower part of the substrate Nsub. In this first exemplary configuration, the charge storage capacity is increased and the rate of charge loss due to recombination is decreased, but there is residual charge.

To alleviate this problem of residual charge, a second exemplary configuration is proposed in FIGS. 9a and 9b.

FIGS. 9a and 9b illustrate a cross section in the plane III-III' and a cross section in the plane IV-IV' of a second exemplary depthwise configuration of the photosite according to the second embodiment illustrated in FIG. 7.

In this second exemplary configuration, an additional semiconductor well Nw2 has been added between the main well Nw1 and the lower part of the substrate Nsub relative to the first exemplary configuration illustrated in FIGS. 8a and 8b. To do this, the lower part of the substrate Nsub has been thinned depthwise. The additional well Nw2 is produced in an additional p-type semiconductor region Pw2, the dopant concentration of which is lower than that of the passivation zone 40.

In order to increase the storage capacity of the charge storage zone, now consisting of the main well Nw1, the additional well Nw2 and the lower part of the substrate Nsub, the additional well Nw2 is laterally pinned. In order to improve charge transfer from the potential well of the additional well Nw2 to the main well Nw1, the additional well is pinned in the second direction DIR1, i.e. in a direction parallel to the front side and orthogonal to the pinning direction of the main well Nw1, and centered in the second direction with the main well.

In this way, it is possible to center the additional well Nw2 with the main well Nw1 in one of the two directions parallel to the front side Av, in this case the second direction DIR2. Centering the additional well Nw2 with the main well Nw1 in one direction improves charge transfer, the maxima of the potential wells being centered in one direction, which implies that in one direction there is no potential barrier to interfere with the transfer of charge from one potential well to another.

The additional well also possesses a pinned width W2 in its pinning direction, i.e. the second direction DIR2, which width is smaller than the pinned width W1 of the main well in its pinning direction, i.e. the first direction DIR1. In addition, the dopant concentration in the additional well Nw2 is lower than the dopant concentration in the main well Nw1. These two characteristics thus ensure that the potential well is present which is less deep than the potential well of the main well Nw1, and thus that all the charge is transferred.

This configuration therefore allows the storage capacity of the charge storage zone to be increased relative to the simpler configuration of the first example, illustrated in FIGS. 3a and 3b, while avoiding residual charge. This is obtained by providing a potential-barrier-free path allowing all the charge stored in the photodiode 200 to be transferred.

This may indeed be seen in FIG. 10, in which the superposition of the main well Nw1, the additional well Nw2 and the lower part of the substrate Nsub, has been shown schematically. The maximum of the potential well of the lower part of the substrate Nsub is located in the center of the square Nsub, through which a central axis passes extending along the first direction DIR1 through the additional well Nw2 and corresponding to the maximum of the potential well of the additional well Nw2. Since the maximum of the potential well extends along the entire length of the central axis, said maximum crosses the maximum of the potential well of the main well Nw1. This is because the maximum of the potential well of the main well Nw1 lies along a central axis extending in the second direction DIR2 and separating the main well into two equal portions.

Figure 11:
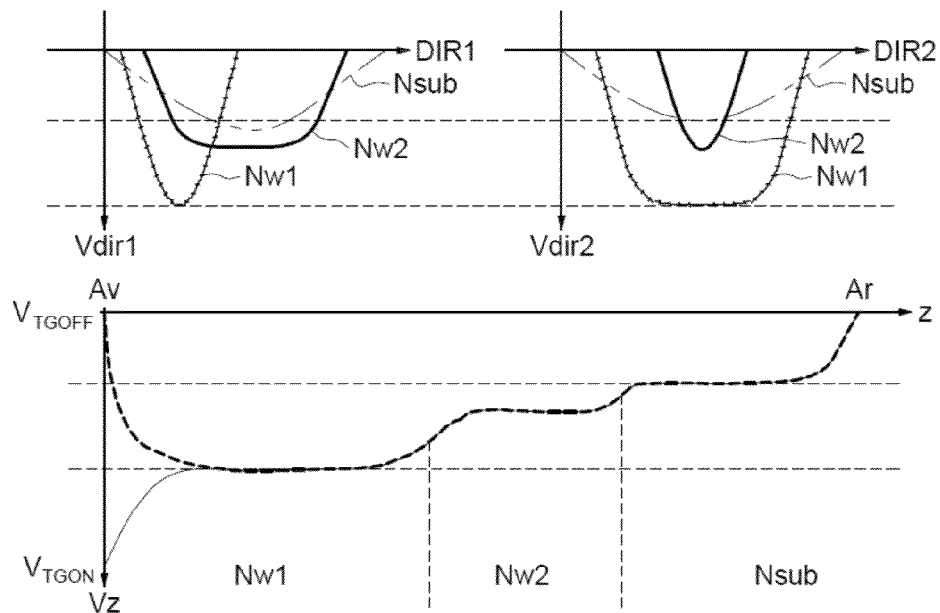
FIG. 11 schematically illustrates the potential wells generated in the semiconductor wells and lower part of the substrate of the photosite in FIGS. 9a and 9b.

FIG. 11 shows potential profiles in the first direction DIR1 parallel to the surface of the substrate, in the second direction DIR2 parallel to the surface of the substrate, and in the depth direction z through the substrate.

In the graphs showing the potential profiles in the first direction DIR1 and in the second direction DIR2, the axis-dashed line represents the potential well generated by the lower part of the substrate Nsub, the continuous line represents the potential well generated by the additional well Nw2, and the crossed line represents the potential well generated by the main well Nw1.

It will be noted that in this second exemplary configuration, the potential-well profiles of the main well Nw1 and of rather the additional well Nw2 are not centered in the first direction DIR1 but rather they are centered in the second direction DIR2, thereby allowing charge to be transferred in the second direction DIR2 without residual charge being left behind. The potential well of the lower part of the substrate Nsub is centered in the first direction DIR1 and in the second direction DIR2, thereby allowing charge to be transferred without residual charge being left behind.

Centering the potential wells of two successive semiconductor wells in one direction thus allows the charge to be completely transferred, with no residual charge being left behind after a charge transfer step.

The third graph shows the variation of the potential in the depth direction z through the substrate between the front side Av and the back side Ar. It may be seen that the potential well of the main well Nw1 is deeper than the potential well of the additional well Nw2, which is itself deeper than the potential well of the lower part of the substrate Nsub.

This allows, during charge transfer from the charge storage zone to the charge read zone SN, all the charge to be transferred, with no residual charge being left behind after the charge transfer.

In order to further increase the charge storage capacity of the second exemplary configuration in the second embodiment of the photosite 100, the additional well Nw2 may be replaced by a succession of several additional semiconductor wells superposed to form a vertical sequence under and in contact with the main well Nw1.

Figures 12A, 12B:
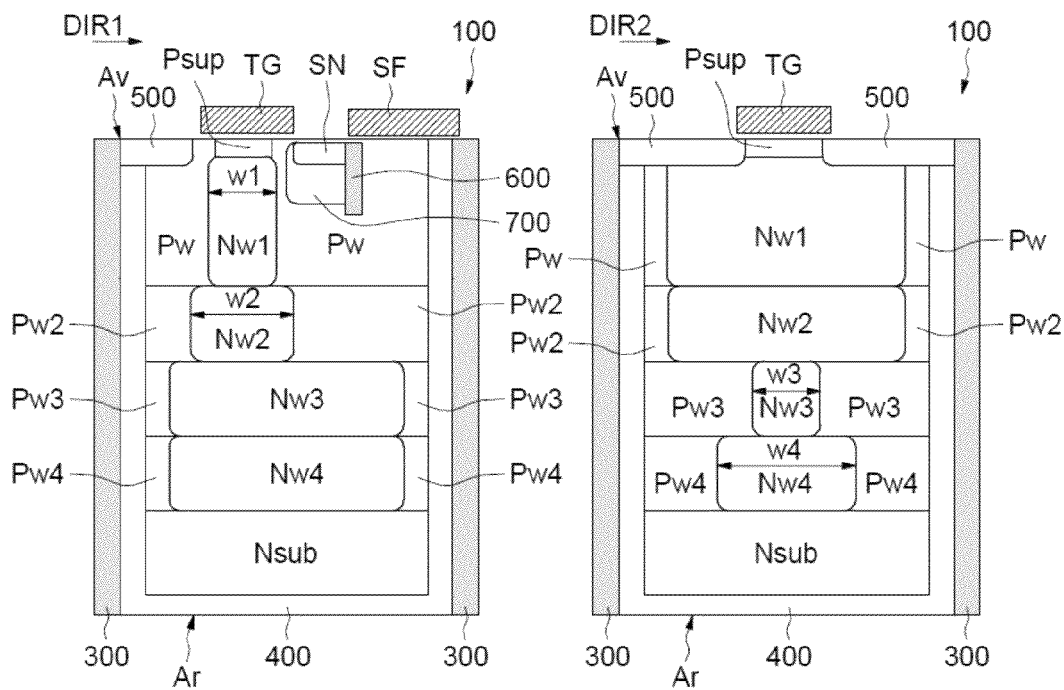
FIGS. 12a and 12b show two cross-sectional views of a third exemplary photosite according to the second embodiment.

Such a configuration is illustrated schematically in FIGS. 12a and 12b. The buried means comprise three additional semiconductor wells Nw2 to Nw4 and the lower part of the substrate Nsub.

The first additional well Nw2 is under and makes contact with the main well Nw1. It is produced in a first additional p-type region Pw2, and is doped n-type with a dopant concentration that is lower than the dopant concentration of the main well Nw1. The first additional well Nw2 is pinned in the first direction DIR1 and has a pinned width W2 that is larger than the pinned width W1 of the main well Nw1. These characteristics ensure that the potential well of the additional well Nw2 is less deep than the potential well of the main well Nw1 and that it is centered in the first and second directions DIR1 and DIR2.

The second additional well Nw3 lies under and makes contact with the first additional well Nw2. It is produced in a second additional p-type region Pw3 and is doped n-type with a dopant concentration that is lower than the dopant concentration of the first additional well Nw2. The second additional well Nw3 is pinned in the second direction DIR2 with a pinned width W3 that is larger than the pinned width W2 of the first additional well Nw2. These characteristics ensure that the potential well of the second additional well Nw3 is less deep than the potential well of the first additional well Nw2 and that it is centered in the second direction DIR2 which ensures a potential-barrier-free transfer path.

The third additional well Nw4 lies under and makes contact with the second additional well Nw3. It is produced in a third additional p-type region Pw4 and is doped n-type with a dopant concentration that is lower than the dopant concentration of the second additional well Nw3. The third additional well Nw4 is pinned in the second direction DIR2 with a pinned width W4 that is larger than the pinned width W3 of the second additional well Nw3. These characteristics ensure that the potential well of the third additional well Nw4 is less deep than the potential well of the second additional well Nw3 and that it is centered in the first and second directions DIR1 and DIR2 which ensures a potential-barrier-free transfer path.

The lower part of the substrate Nsub is centered with the third additional well Nw4 and possesses a dopant concentration lower than the dopant concentration of the third additional well Nw4, thus ensuring that a potential well is generated that is less deep than the potential well of the third additional well Nw4 and centered with the latter in the first and second directions DIR1 and DIR2.

The buried means of a photosite 10 of the first embodiment may also comprise such a vertical sequence of additional semiconductor wells.

A photosite is thus provided comprising a vertically confined photodiode comprising a laterally pinned charge storage zone and a zone comprising buried means allowing the loss of charge due to electronic recombination in the passivation zones surrounding the charge collection zone of the photodiode of the photosite to be reduced, and increasing the charge storage capacity of the photodiode both for large photosites with a charge transfer transistor centered relative to the front side of the photosite and for small photosites with a charge transfer transistor arranged off-center relative to the front side of the photosite.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A photosite, comprising:
   a semiconductor substrate of a first conductivity type and having an upper surface; and
   a photodiode confined in a direction orthogonal to the upper surface of the substrate, comprising:
      a first well in the substrate and having a second conductivity type opposite the first conductivity type;
      a semiconductor zone configured to store charge comprising a second well of the first conductivity type that is formed in the first well and laterally pinned in a first direction parallel to the surface of the substrate by the first well;
      a third well in the substrate and having the second conductivity type placed between the first well and a first conductivity type region in a lower part of the substrate; and
      an additional semiconductor zone configured to store charge comprising a fourth well of the first conductivity type that is formed in the third well and laterally pinned in the first direction by the third well, the fourth well buried under and making contact with the second well.

2. The photosite according to claim 1, wherein the fourth well has a lower dopant concentration than a dopant concentration in the second well.

3. The photosite according to claim 2, wherein the fourth well has a laterally pinned width greater than a laterally pinned width of the second well in the first direction.

4. The photosite according to claim 3, wherein the fourth well has a laterally pinned width in a second direction less than a laterally pinned width of the second well in the second direction, wherein the second direction is orthogonal to the first direction.

5. The photosite according to claim 1, wherein the fourth well comprises a vertical sequence of a plurality of wells of the first conductivity type including a first additional well buried under and making contact with the second well and a second additional well buried under and making contact with the first additional well.

6. The photosite according to claim 5, wherein the third well comprises a plurality of additional well regions of the second conductivity type including a first additional well region laterally pinning the first additional well and a second additional well region laterally pinning the second additional well.

7. The photosite according to claim 6, wherein the first additional well has a lower dopant concentration than a dopant concentration in the second well and the second additional well has a lower dopant concentration than a dopant concentration in the first additional well.

8. The photosite according to claim 7, wherein the first additional well has a laterally pinned width greater than a laterally pinned width of the second well in the first direction, and the second additional well has a laterally pinned width greater than the laterally pinned width of the first additional well in the first direction.

9. The photosite according to claim 8, wherein the first additional well has a laterally pinned width in a second direction substantially equal to a laterally pinned width of the second well in the second direction, wherein the second direction is orthogonal to the first direction, and the second additional well has a laterally pinned width less than the laterally pinned width of the first additional well in the second direction.

10. The photosite according to claim 5, wherein the vertical sequence further comprises a third additional well buried under and making contact with the second additional well.

11. The photosite according to claim 10, wherein the third well comprises a plurality of additional well regions of the second conductivity type including a first additional well region laterally pinning the first additional well, a second additional well region laterally pinning the second additional well and a third additional well region laterally pinning the third additional well.

12. The photosite according to claim 11, wherein the first additional well has a lower dopant concentration than a dopant concentration in the second well, the second additional well has a lower dopant concentration than a dopant concentration in the first additional well and the third additional well has a lower dopant concentration than a dopant concentration in the second additional well.

13. The photosite according to claim 12, wherein the first additional well has a laterally pinned width greater than a laterally pinned width of the second well in the first direction, the second additional well has a laterally pinned width greater than the laterally pinned width of the first additional well in the first direction, and the third additional well has a laterally pinned width substantially equal to the laterally pinned width of the second additional well in the first direction.

14. The photosite according to claim 13, wherein the first additional well has a laterally pinned width in a second direction substantially equal to a laterally pinned width of the second well in the second direction, wherein the second direction is orthogonal to the first direction, the second additional well has a laterally pinned width less than the laterally pinned width of the first additional well in the second direction, and the third additional well has a laterally pinned width greater than the laterally pinned width of the second additional well in the second direction.

15. The photosite according to claim 1, wherein the fourth well comprises a vertical sequence of a plurality of additional wells lying between the second well and the first conductivity type region in a lower part of the substrate, each additional well of the vertical sequence only making contact with a preceding additional well and a following additional well.

16. The photosite according to claim 15, in which the additional well buried immediately under and making contact with the second well has a lower dopant concentration than a dopant concentration in the second well, and each other additional well in the vertical sequence has a lower dopant concentration than a dopant concentration in the additional well under which it is buried.

17. The photosite according to claim 15, wherein the additional wells of the vertical sequence are laterally pinned in the first direction.

18. The photosite according to claim 17, wherein each additional well laterally pinned in the first direction is centered, in the first direction, with the well under which it is buried.

19. The photosite according to claim 15, wherein the additional wells of the vertical sequence are is laterally pinned in a pinning direction corresponding to a second direction parallel to the surface of the substrate and orthogonal to the first direction.

20. The photosite according to claim 19, wherein each additional well laterally pinned in the second direction is centered, in the second direction, with the additional well under which it is buried.

21. The photosite according to claim 15, wherein the second well possesses a pinned width in a lateral pinning direction, wherein each additional well possesses a corresponding pinned width in the lateral pinning direction, the corresponding pinned width of the additional well buried immediately under and making contact with the second well being larger than the pinned width of the second well, and each other additional well having a pinned width in the lateral pinning direction that is larger than the pinned width of the additional well immediately under which it is buried.

22. The photosite according to claim 1, wherein the photodiode is an element of a matrix array of photosites of an imaging device formed in the semiconductor substrate.

* * * * *

UNITED STATES PATENT AND TRADEMARK OFFICE
CERTIFICATE OF CORRECTION

| | | |
|---|---|---|
| PATENT NO. | : 9,099,366 B2 | Page 1 of 1 |
| APPLICATION NO. | : 13/529045 | |
| DATED | : August 4, 2015 | |
| INVENTOR(S) | : Roy et al. | |

It is certified that error appears in the above-identified patent and that said Letters Patent is hereby corrected as shown below:

In the Claims:

Column 14, claim 19, line 18, please delete the word "is".

Signed and Sealed this
Eighth Day of December, 2015

Michelle K. Lee
*Director of the United States Patent and Trademark Office*